United States Patent
Rügheimer et al.

(10) Patent No.: US 11,501,681 B2
(45) Date of Patent: Nov. 15, 2022

(54) ARRANGEMENT FOR A DISPLAY AND METHOD

(71) Applicant: OSRAM OLED GmbH, Regensburg (DE)

(72) Inventors: Tilman Rügheimer, Regensburg (DE); Hubert Halbritter, Dietfurt-Toeging (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 17/251,072

(22) PCT Filed: May 24, 2019

(86) PCT No.: PCT/EP2019/063540
§ 371 (c)(1),
(2) Date: Dec. 10, 2020

(87) PCT Pub. No.: WO2019/238394
PCT Pub. Date: Dec. 19, 2019

(65) Prior Publication Data
US 2021/0209991 A1 Jul. 8, 2021

(30) Foreign Application Priority Data
Jun. 13, 2018 (DE) .......... 102018114175.0

(51) Int. Cl.
G09G 3/20 (2006.01)
G09G 3/32 (2016.01)
(Continued)

(52) U.S. Cl.
CPC ............. *G09G 3/2003* (2013.01); *G09G 3/32* (2013.01); *G09G 3/3426* (2013.01);
(Continued)

(58) Field of Classification Search
CPC ...... G09G 3/3233; G09G 3/32; G09G 3/2003; G09G 3/3426; G09G 2300/0842;
(Continued)

(56) References Cited

U.S. PATENT DOCUMENTS 8,581,271 B2   11/2013  Shikina et al.
8,773,451 B2 *  7/2014  Marcu .................. G09G 3/2003
                                                    345/589
(Continued)

FOREIGN PATENT DOCUMENTS

DE   102011055172 A1   6/2012
JP   2010249892 A      11/2010
(Continued)

*Primary Examiner* — Vinh T Lam
(74) *Attorney, Agent, or Firm* — Slater Matsil, LLP

(57) ABSTRACT

In an embodiment an arrangement includes a plurality of pixels, wherein each pixel includes at least two subpixels of each color, wherein each color is defined by a predefined target color location, wherein each subpixel comprises an optoelectronic component defined by a color location, wherein the color locations of the optoelectronic components of each color is chosen such that during operation of the optoelectronic components the predefined target color location is met for each color, wherein the optoelectronic components for each color are of identical design, and a controller configured to commonly control the optoelectronic components of a color.

17 Claims, 3 Drawing Sheets

(51) Int. Cl.
G09G 3/34 (2006.01)
H01L 25/075 (2006.01)
H01L 27/12 (2006.01)
H01L 33/62 (2010.01)

(52) U.S. Cl.
CPC ...... *H01L 25/0753* (2013.01); *H01L 27/1214* (2013.01); *H01L 33/62* (2013.01); *G09G 2300/0452* (2013.01); *G09G 2300/0809* (2013.01); *G09G 2320/0242* (2013.01); *G09G 2320/0666* (2013.01); *H01L 2933/0066* (2013.01)

(58) Field of Classification Search
CPC ... G09G 2320/0242; G09G 2300/0809; G09G 2300/0452; G09G 2300/0426; G09G 2320/0666; H01L 25/0753; H01L 33/62; H01L 27/1214; H01L 2933/0066
See application file for complete search history.

(56) References Cited

U.S. PATENT DOCUMENTS

| | | | |
|---|---|---|---|
| 8,963,412 B2 | 2/2015 | Miura | |
| 10,123,005 B2 * | 11/2018 | Gu | G09G 3/006 |
| 10,598,318 B1 * | 3/2020 | Bohler | C09D 11/50 |
| 2005/0012457 A1 * | 1/2005 | Wu | H01L 25/167 |
| | | | 257/E25.032 |
| 2010/0259165 A1 | 10/2010 | Miura | |
| 2011/0050550 A1 | 3/2011 | Tsai et al. | |
| 2011/0074750 A1 * | 3/2011 | Leon | G09G 3/30 |
| | | | 345/207 |
| 2011/0284881 A1 | 11/2011 | Shikina et al. | |
| 2012/0162168 A1 | 6/2012 | Ku et al. | |
| 2012/0293399 A1 | 11/2012 | Haskin | |
| 2015/0097877 A1 * | 4/2015 | Lin | G09G 3/344 |
| | | | 345/107 |
| 2015/0144925 A1 | 5/2015 | Baek et al. | |
| 2016/0275874 A1 * | 9/2016 | Lin | G09G 3/2011 |
| 2016/0322542 A1 * | 11/2016 | Akagawa | C09K 11/617 |
| 2017/0196060 A1 * | 7/2017 | Watanabe | H01L 33/54 |
| 2019/0073944 A1 * | 3/2019 | Li | G09G 3/2003 |
| 2019/0140144 A1 * | 5/2019 | Omori | H01L 33/62 |

FOREIGN PATENT DOCUMENTS

| | | | | |
|---|---|---|---|---|
| JP | 2013065726 A | * | 4/2013 | ............ H01L 24/19 |
| KR | 20150061558 A | | 6/2015 | |
| WO | 2011145174 A1 | | 11/2011 | |
| WO | WO-2016147552 A1 | * | 9/2016 | ........... G09G 3/2003 |

* cited by examiner

ARRANGEMENT FOR A DISPLAY AND METHOD

This patent application is a national phase filing under section 371 of PCT/EP2019/063540, filed May 24, 2019, which claims the priority of German patent application 102018114175.0, filed Jun. 13, 2018, each of which is incorporated herein by reference in its entirety.

TECHNICAL FIELD

The invention relates to an arrangement with a plurality of pixel as well as a backplane, in particular for a display. The invention relates further to a method for manufacturing the same.

BACKGROUND

For LED displays in some applications µLED-components are used, which correspond to one of the three primary colors. Three of these multicolor µLED-components form together a pixel. Correspondingly, each pixel has three subpixels, which are individually controlled responsible for the coloring by the three primary colors RGB. µLED-Components in turn excel by a very small form factor in the range of a few 10 µm.

In the manufacturing of such µLED-components it can come to fluctuations during the placing of the different semiconductor layers, this concerns in particular the epitaxial growth of the active semiconductor layer (e.g. InGaN, InGaAlP). This results in manufacturing fluctuations over a wafer, which typically comprises several million of such µLED-components. In particular, it can come to so called color location deviations, i.e. due to the manufacturing fluctuations the µLED-components are subject to a distribution with regards to their color location. As a consequence, in operation the dominant wavelength can deviate from the design wavelength and the emission spectrum can be widened, what influences the color purity.

For the manufacturing of particularly high-quality displays a very small color location deviation between pixels is needed, i.e. the subpixel of each pixel should differ in their color location only slightly. On the other hand, there is the above-mentioned distribution of µLED-components during the manufacturing.

A standard method is now to characterize and to group the µLED-components with regard to some parameters, such as the color location. Only pixels of the same color location and of the same characterization, respectively for the manufacturing of a display are then used. Admittedly, this can work for the manufacturing of individual displays, however, it can come to a different distribution between different displays. Furthermore, the grouping step is connected with substantial handling effort, resulting in costs.

SUMMARY

Embodiments provide an arrangement and a manufacturing process for a display, at which the above-mentioned problems are reduced.

In one embodiment arrangement, in particular a display arrangement, is proposed with a plurality of pixel, wherein each pixel comprises at least two subpixels of each color, wherein the color is defined by a predefined target color location. Each subpixel of a color comprises each an optoelectronic component defined by a color location, wherein the color locations of the optoelectronic components are chosen such, that an operation of the two optoelectronic components results in the predefined target color location. Furthermore, a control unit is foreseen, which is designed to commonly control the optoelectronic components of a color.

Thus, in the arrangement proposed the problem of different color locations of two or more subpixels belonging to different pixels is solved by having foreseen at least two subpixels each per color and per pixel. The subpixels comprise optoelectronic components, the respective color location of which can differ from the target color location. The composition of the color locations during the operation of the two subpixels, respectively, components results again in the target color location. Naturally, also components can be used, whose color location corresponds to the target color location. In addition, the full width at half maximum of the emission spectrum can be changed by the composition. By the common control the correct composition is ensured. Thus, all pixels of a display comprise the same color locations, and also different displays can be set to the same color space.

This approach is in particular appropriate, when the optoelectronic components of one or more wafers, respectively, charges due to occurring production distributions are classified in groups ("Bins"). Besides a distribution of the color locations in the manufacturing also other distributions can occur, e.g. brightness, threshold voltage and the like. Correspondingly, the components are then divided into groups.

In one embodiment the control unit is designed to provide the optoelectronic components with the same current. Therewith it is ensured, that there will be a correct color composition of the respective color locations. In this embodiment there is no correction of brightness differences. In another embodiment the control unit is designed to provide one of the optoelectronic components with a predefined rated current and the other component with a higher current or a lower current than the rated current. Therewith not only color location but also small differences in the brightnesses can be compensated then.

In one embodiment of the proposed principle, the control unit comprises three control lines. These control lines serve for the control of always one subpixel of different color in the respective pixel. Each one control line is coupled with switch inputs of at least two switching transistors, which each are connected to one of the optoelectronic components. Thus, there is a switching transistor for each of the at least two subpixels of each color in a pixel, wherein the control line addresses the switching transistors.

The transistors can comprise the same electrical properties. Thereby it is ensured, that in an operation the same current flows through the transistors connected to the optoelectronic components.

In another embodiment the control unit comprises at least four switching transistors. Two of these transistors are designed to switch at the same control signal a predefined rated current. The two others of the at least four switching transistors are designed to switch a higher, respectively, a lower current than the rated current. In other words, two of the switching transistors comprise the same electrical properties, while the electrical properties of the two other transistors differ from the properties of the equal transistors. Thus, it becomes possible to send different currents through the optoelectronic components, and thus to compensate brightness differences. The control line is in one aspect coupled with all switching transistors for the control of the same.

In a further embodiment, the control unit comprises one capacitor each, which is connected to the control line. Thereby in an operation a potential defined by the capacitor can be applied to a control input of the switching transistor. Equally it can be foreseen, that the control unit comprises further at least one control transistor, which is in each case connected between a control line and the with the control line coupled switch inputs of the at least two switching transistors.

In another embodiment the switching transistors are on the input or on the output side connected to a contact pad, which contacts the respective optoelectronic component. In one embodiment with three or more switching transistors the current through the components can be defined by an appropriate contacting of the optoelectronic components with the respective contact pad. Thereby a current through the components is set by means of the electrical properties of the switching transistors and the appropriate placement and contacting on the assigned contact pad.

Another embodiment relates to the circuit arrangement. This allows optoelectronic and light emitting components, which are arranged in parallel, to be connected both on the anode- and on the cathode side with a common potential terminal. In this way, in the arrangement and in particular at the control unit a supply line and a reference potential line can be foreseen. In each case one of the at least two switching transistors is connected in series with an optoelectronic component. This is done in such a manner, that either the optoelectronic component is connected via the switching transistor with the supply line or that the optoelectronic component is connected via the switching transistor with the reference potential line. Thus, both concepts can be realized with the proposed principle.

In another embodiment of the proposed principle a backplane is foreseen, wherein the backplane comprises an integrated control unit and a surface. The backplane can in particular be designed for a display or a light assembly. Furthermore, the backplane comprises a number of in rows and columns arranged pixels defined by a position on the surface of the backplane, wherein each pixel comprises at least two subpixels of each color. Each subpixel comprises at least a contact pad, which is designed to get connected with an optoelectronic component. Thus, it will be foreseen several subpixels per color of a pixel on the surface of the backplane. Thereby a different assembly of the individual subpixel can be carried out, and thus differences in color location, respectively, the brightness of the individual optoelectronic components be compensated.

A control takes place in the backplane, wherein for this purpose the control logic and in particular different currents or voltages are already defined. The selection of the currents takes place by appropriate assembly with the selected optoelectronic components.

In one embodiment, the at least two subpixels of each color comprise at least two p-contact pads, which are designed for receiving an optoelectronic component. Furthermore at least one n-contact pad is foreseen, which is designed for the electrical contacting with the optoelectronic component. The p-contact pads, for example, can have a different size compared to the n-contact pads. In addition, they can be slightly larger than the optoelectronic components, so that, when the backplane is mounted with components, these slight dislocations will be compensated. The p-contact pads can in particular be designed larger than the n-contact pads, so that the optoelectronic components can be applied with their anode contact directly to the p-Contact pads.

In a further embodiment the control unit is designed to provide an equal reference current to the contact pads of the at least two subpixels of each color. Thereby, the same current is conducted in each case through the optoelectronic components. In an alternative embodiment the control unit is designed to provide a first current to a first contact pad of the subpixel and a second current to a second contact pad of the subpixel. Thus, the backplane provides contact pads, which are connected with the control unit such, that in operation different currents flow through this. By an appropriate assembly of the contact pads with optoelectronic components brightness differences in the components and with this in the pixels and differences in the color locations can be compensated in such a way.

Another embodiment relates to a method for manufacturing a display comprising a plurality of pixel cells. In one aspect a matrix is provided, which can comprise a plurality of pixels arranged in rows and columns. Each pixel comprises per color at least two subpixel surfaces, wherein the color is defined by a predefined target color location. Subsequently, at least two of the subpixel surfaces are mounted each with an optoelectronic component defined by a color location such, that the predefined target color location results in an operation of the two optoelectronic components.

For this purpose, it can be foreseen, that at least two optoelectronic components are chosen from a plurality of optoelectronic components, which is divisible in at least two groups, which comprise each a different color location.

In another embodiment the at least two subpixel surfaces comprise at least two first contact pads and at least one second contact pad. Moreover, also two first contact pads and four second contact pads can be foreseen, if besides color location also brightness differences between subpixels of equal color on the backplane are to be compensated. Then the step of an assembly furthermore comprises an application and electrical connecting of a first optoelectronic components on a first of the at least two first contact pads. The electrical connecting can take place by a direct process, hence in particular without wire bonding. The optoelectronic component can be placed on the first contact pad with its anode terminal or p-contact and be electrically connected. Then an electrical connecting takes place, in particular bonding of the first optoelectronic components and the second optoelectronic components with the at least one second contact pad.

In one embodiment all subpixel of one color in this manner can be mounted with components before an assembly of the subpixel of a further color takes place. Also, at first all optoelectronic components can be placed on the first contact pads and be electrically connected. Only subsequently the bonding step takes place. Thereby the manufacturing process becomes more efficient, since same manufacturing steps are carried out together at a time. Further aspects and embodiments are subject of the subsequent claims.

BRIEF DESCRIPTION OF THE DRAWINGS

In the following the proposed principle is explained in detail using several exemplary embodiments by means of drawings.

DETAILED DESCRIPTION OF ILLUSTRATIVE EMBODIMENTS

In the following for illustration the term "µLED-component" is used. Thereby embodiments are not limited hereon but in principle each optoelectronic component regardless of the type or manufacturing can be taken into account. Likewise, the terms "display" and matrix are used. A display, respectively, matrix is an arrangement with a number of in rows and columns arranged and individually controllable pixels, of which each pixel is designed at least for the representation of the three primary colors. These can be for example the RGB colors. For this purpose, each pixel comprises a plurality of subpixels. The display, respectively, the matrix can be on hand in form of one or several modules and implement appropriate control circuits. Likewise, embodiments not limited to the shown embodiments. Thus, the control can contain further elements, for example resistors, driving circuits or the like. Likewise, a combination of the proposed principle with conventional display structure is possible, so that for example pixel with a subpixel per color is combined with pixels with several subpixels per color. In the following embodiments are explained also by means of examples, which amongst others are appropriate for displays. Backplanes and similar elements also can be used for displays. However, the core idea of the embodiments are not limited on displays or the application in displays. Rather, all applications and embodiments are to be included, which need pixels and in particular pixels of different color. For example, also lighting elements for vehicles are part of this, as interior lightings. Another application would be an instrument lighting. Also advertising spaces or indicating devices e.g. in train stations can be realized in the way proposed.

Figure 1:
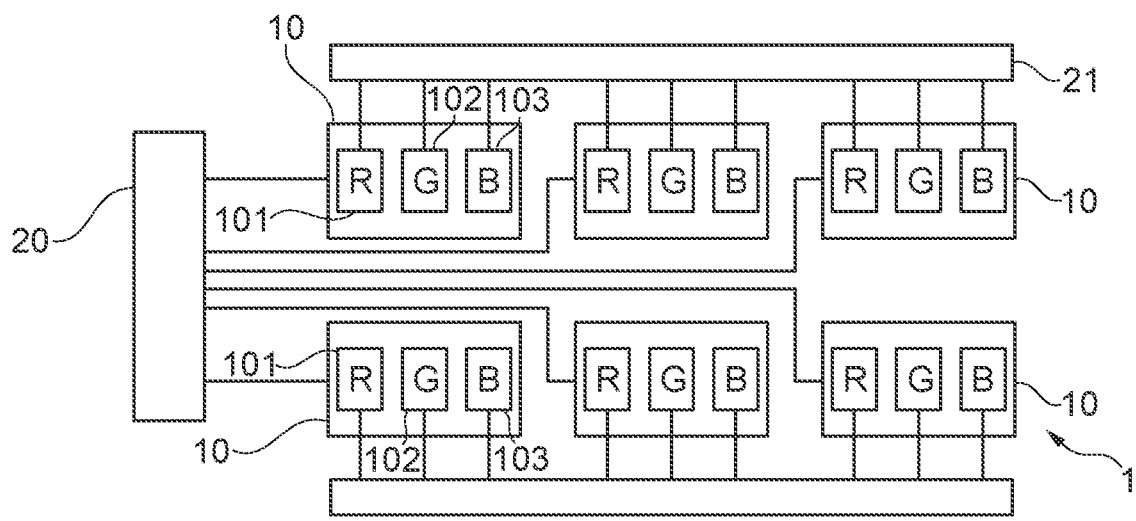
FIG. 1 shows a schematic view of a backplane.

FIG. 1 shows a schematic embodiment of a display backplane 1 with a plurality of pixels 10 arranged in rows and columns, which each comprise a subpixel 101, 102, 103 of each color R(ed), G(reen), B(lue) and are individually controllable. For this purpose, are control circuits 20 and 21 foreseen, which control the individual pixels at every time. The subpixel 101 to 103 are individually controlled by the control circuit 21. On the surface of the backplane 1 a plurality of contact pads is arranged (not shown here), which are connected with the corresponding LED-components for the individual colors R, G, B. For this purpose, the LED-components can comprise for the generation of the corresponding color each appropriate semiconductor material systems. Alternative or in addition also conversion dyes can be used. In high-quality displays µLED-components come into operation, the dimensions of which are in the range of a few 10 µm. Thereby lies the control electronics and in particular the control lines with the switching transistors 111 the backplane. The µLED-components are placed on the contact pads and connected with these. Further control devices can be foreseen externally.

In the production of µLED-components there are in the individual epitaxy steps slight variations, for example in the doping or the layer thickness, where across a manufacturing wafer slight changings of the electrical and optical properties of the individual µLED-components on the wafer result. Such a typical changing is the color location, which at the µLED-components across the wafer and also between different wafer charges can differ slightly from the target color location (corresponding the design wavelength).

Figure 2:
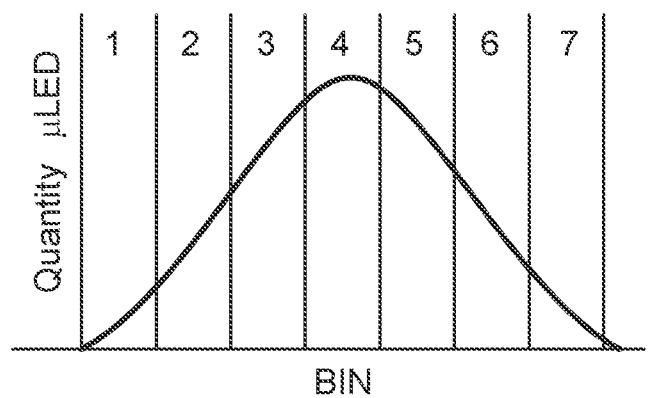
FIG. 2 shows an exemplary distribution of a production charge of μLED-components over the color location.

FIG. 2 shows a with respect to the color location exemplary distribution of µLED-components over one or more wafer charges. The individual µLED-components are now divided into groups, so-called BINs, wherein each BIN is characterized by a dominant wavelength of the µLED-components, which defines the color location. In the representation a distribution in 7 groups is carried out. Into the 4. group or BIN 4 the most µLED-components fall.

In the conventional manufacturing of displays preferably µLED of the same BIN are used now, to minimize deviations of the color location from pixel to pixel in one color. However, this can lead to the fact, that due to the distribution of the µLED-components in the production not all BINs are used equally. In addition, it can come now to fluctuations color location of one color between the displays, when µLED-components of different BINs are used for the displays.

Figure 3:
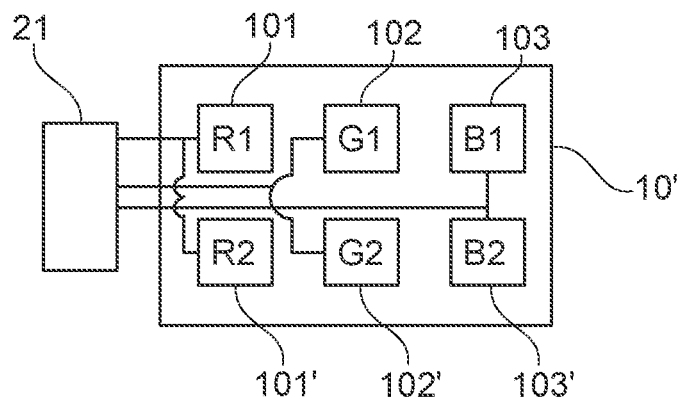
FIG. 3 shows embodiments of the proposed principle in form of a schematic representation.

FIG. 3 exemplifies an embodiment of an individual pixel, at which the above-mentioned problems are reduced. Such pixels can be used instead of the pixels shown in FIG. 1. The pixel according to the proposed principle comprises instead of a conventional subpixel per color now a plurality of subpixels per color. In the embodiment according to FIG. 3 each pixel 10' comprises two subpixels each, namely R1, R2 for the subpixels 101, 101' of the color red, G1, G2 for the subpixels 102, 102' of the color green and B1, B2 for the two subpixels 103, 103' of the color blue. The control 21 is designed such, that the two subpixels of each color are controlled by a common control line.

By appropriate choice of the µLED-Components the color location can be defined, so that it results in a desired target color location. Thereby the inventors make use of the fact, that a target color location can be defined by composition of color locations in an area. This shall be exemplarily explained at the distribution of the FIG. 2, at which the color location is divided into 7 groups. The target color location be the color location, which corresponds to the BIN 4. In an assembly of a display 2 µLED-components from the BIN 4 can now be used, but also a combination of µLED-components of the BIN 3 and 5, respectively, BIN 2 and 6 or 1 and 7. As far as even three subpixels per color per pixel are used further combinations of µLED-components result from the distribution of FIG. 2. The table below exemplifies the possible combinations for 2, respectively, 3 subpixels per color from a distribution of µLED in overall 7 groups.

| combination of 2 subpixels per color | combination of 3 subpixels per color |
|---|---|
| (4, 4) | (4, 4, 4) |
| (3, 5) | (3, 4, 5) |
| (2, 6) | (2, 4, 6) |
| (1, 7) | (1, 4, 7) |

Naturally, from another distribution of the groups or another target color location combinations result, which deviate therefrom. However, the advantage is, that substantially all µLEDs of a distribution can be used for the manufacturing of displays and that the color location differs less from display to display.

In the embodiment of FIG. 3 in each case two subpixels 101, 101', 102 and 102' as well as 103 and 103' are assigned to one color per pixel, each pixel thus contains 6 subpixels. The μLED-components are applied to contact pads and electrically contacted. The control is designed such, that the two subpixels of each color are controlled simultaneously.

Figure 4:
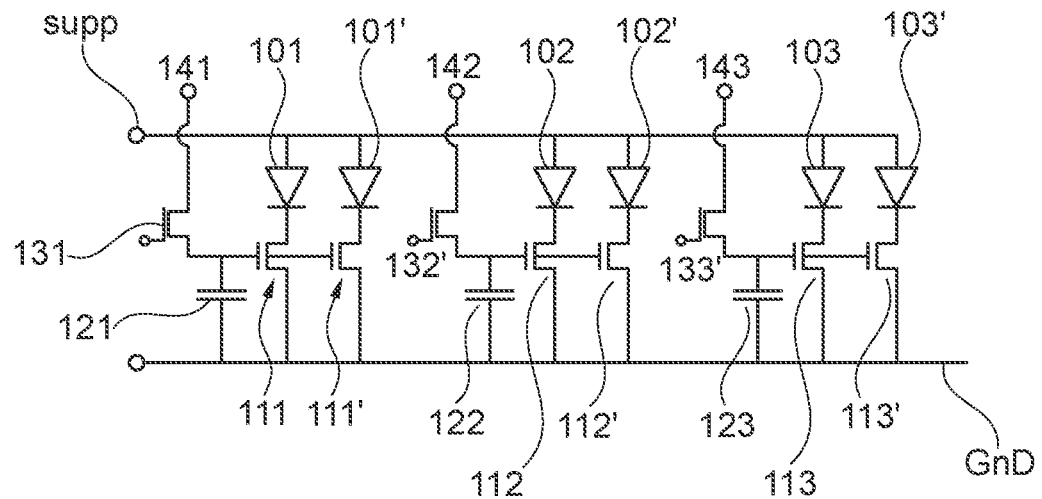
FIG. 4 shows an embodiment of a circuit arrangement to clarify aspects according to the proposed principle.

FIG. 4 shows an embodiment of such a control for a pixel, which comprises two subpixels each for each color. Each μLED is connected with its anode terminal to a common supply line Supp. This represents a simplification, since the individual μLED-components indeed comprise for the different colors different forward voltages and thus can have different supply voltage lines. In this embodiment the μLED-components 101, 101' to 103' are chosen such, that their respective color location composition corresponds to a respective target color location. Thereby, each μLED-component corresponds to a subpixel as represented in FIG. 3. The respective cathode terminals of the μLED-components are connected to a switching transistor. More specifically the μLED-component 101 is connected to transistor 111 and μLED-component 101' with switching transistor 111'. In the same way also the μLED-components, 102, 102' and 103, 103' are connected to the switching transistors assigned to them. The output of the respective switching transistor 111, 111' to 113' is connected to a ground potential Gnd. The control terminals of the respective switching transistors are connected to the switching lines 141, 142 and 143 via a respective control transistor 131, 132', 133'. The control transistor thus controls the switching transistors for each subpixel. Beside it, is between the control transistors of each subpixel and the control terminals of the switching transistors a capacitor 121, 122, 123 connected against the ground potential Gnd. Thus, for n subpixels there are 1+n transistors, one transistor for programming and n switching transistors.

The switching transistors 111 and 111' are built up with the same material and geometrical parameters, such that their respective electrical properties are substantially the same. This also applies for the respective switching transistors of the other subpixels. Thereby the switching transistors between the respective subpixels can differ in their geometrical and thus electrical properties. This is in this case appropriate, to compensate the different electrical properties of the different colored μLED-Components, for example a different threshold voltage due to the different material systems of the μLED-components. Typical geometrical properties of the switching transistors are, for example, the gate length d or the gate width w.

During operation of the circuit a defined voltage is applied to the control inputs via a signal at the control input of the respective control transistors 131,132', respectively, 133'. These are also stored in the capacitor 121, 122 and 123. In other words, in this way the signal at the control input of the control transistors 131, 132' and 132' remains active only until the respective capacitor is charged to the desired voltage. For this purpose, a defined voltage signal is applied to the terminals 141 to 143. In an alternative operation mode, a variable voltage signal is applied to the terminals 141, 142 and 143 by a drive circuit not represented here. Thereby, the magnitude of the voltage between the terminals can be variable, the signal at the control terminals of the control transistors 131, 132' and 133' on the other hand, is constant. In both cases the respective capacitor is charged up to the desired voltage value.

The voltage across the respective capacitor is applied in the same way also to the control terminals of the switching transistors of the respective subpixels (respectively, to their gates). Both switching transistors of each subpixel therefore form a variable, but equal-sized resistor, whereby the current flow through the μLED-components of each subpixel and thus the brightness is controlled. Thus, for identically designed switching transistors the μLED-components can despite differences in the forward voltage (Vf) be impressed the same current. The inhomogeneous current division in a parallel circuit of μLED-components with varying Vf is thus intercepted. The color location provided by the composition of the emitted light of the two μLED-components corresponds to the target color location.

Figure 5:
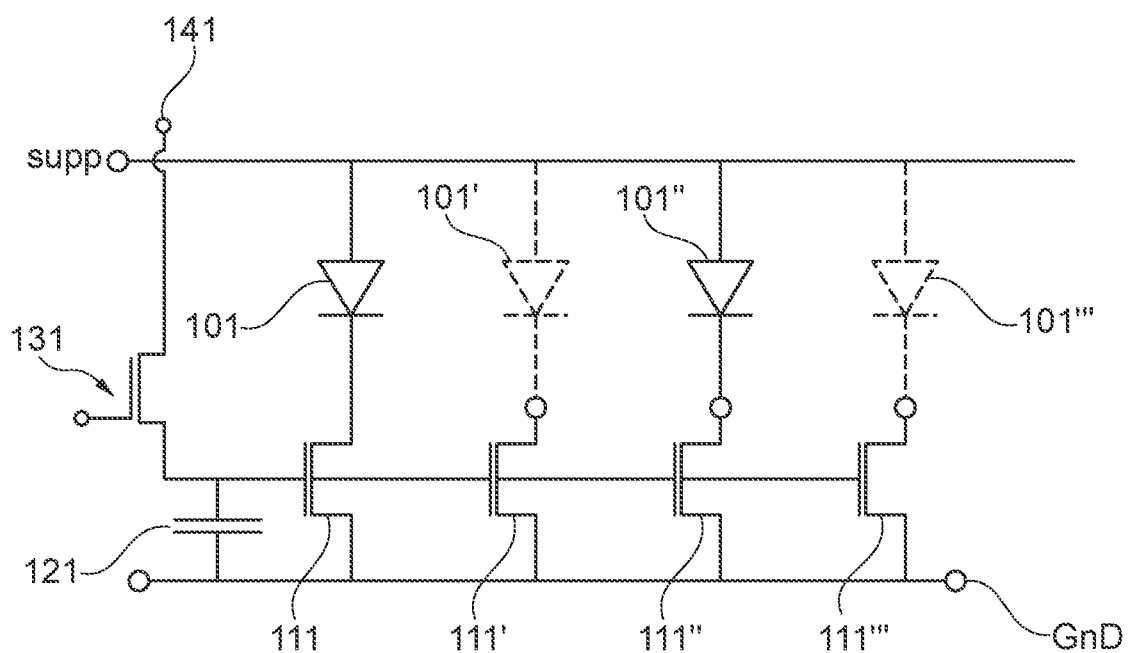
FIG. 5 shows an alternative embodiment to clarify further aspects.

FIG. 5 shows a further embodiment of an individual subpixel with further additions, in the example for the color R(ed). This example is based on the further knowledge, that for further improvement of the color composition possibly present brightness differences of the μLED-components at the same operation current have to be taken into account. For this purpose, in addition to the 2 switching transistors 111 and 111' per pixel, which due to their similar geometrical dimensions provide the same operation current, further transistors 111" and 111''' are kept. These are each connected between the reference potential connection Gnd and a dedicated assembly surface on a surface of the backplane in each subpixel. This additional assembly surface drawn μLED-components 101" and 101''' are represented.

The additional switching transistors 111" and 111''' are designed differently than the transistors 111 and 111'. For example, at switching transistor 111" the gate width w is increased by 10% in relation to the gate width of the switching transistors 111, this of the switching transistor 111''' is by 10% lower. Thereby, at the same gate voltage through the switching transistor 111" and thus through the μLED-Component 101" a 10% higher current flows, through the switching transistor 111''' a 10% lower current. By appropriate choice of the geometrical parameters various differences in relation to the "rated current" through the switching transistor 111 can be realized in this way. The difference of the currents compared to the "rated current" amounts thereby preferably 10% but can amount also 20% or only 5%.

In the example represented contact pads are mounted correspondingly to the μLED-components 101 and 101", both the others remain empty. This assembly takes place during the manufacturing of the backplane with μLED-components for each subpixel of a pixel, so that both the color location and the brightness correspond to a respective target value. At the assembly and contacting it is decided dependent on the color location, respectively, brightness groups provided, which subpixels are mounted and connected.

The control of the displays does not change therewith, since per pixel and color still only one control signal is needed. Dependent on the assembly of the redundant subpixel with LEDs of an appropriate BIN a narrow color location distribution is achieved.

The proposed principle requires that the backplane is foreseen in appropriate manner to be mounted with the μLED-components in such a way, that the desired target color locations for the respective pixel results therefrom. In other words, the appropriate combinations of μLED-components from the color location and brightness groups are chosen in such a manner, that the desired values result. For this purpose, the backplane is provided with the respective contact pads, the control as shown in the schematic circuit diagrams in FIGS. 4 and 5 is realized in the backplane.

Thereby, each μLED-component comprises a p- and a n-contact corresponding an anode and a cathode terminal. In the embodiments of FIGS. 4 and 5 the anode terminal (p-side) is connected with the supply line and the cathode terminal with the switching transistor. Therewith also contact pads for the p-, respectively, n-contacting on the backplane are necessary for each subpixel.

Figure 6:
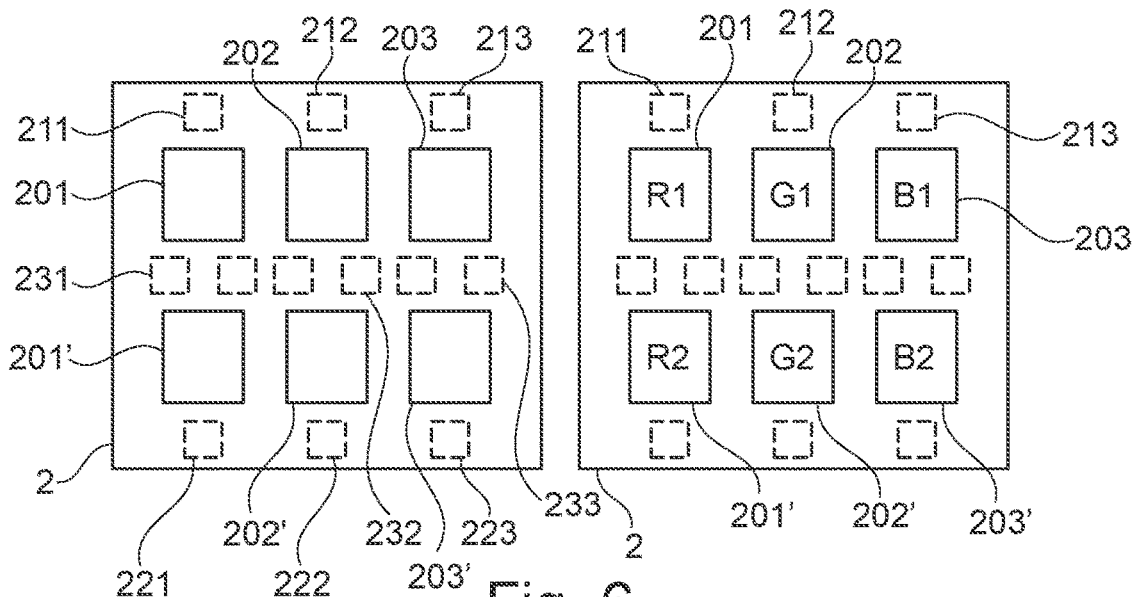
FIG. 6 shows a section of a surface of a backplane to represent different aspects of the proposed principle.

FIG. 6 shows a section of a surface of a backplane of a display, which comprises several subpixels per color and pixel. The two pixels 2 are localized on the backplane and to each are contact pads assigned, which correspond to the subpixels and colors. More specifically each pixel 2 comprises on the surface each two subpixels per color. For this purpose, on the surface contact pads are arranged to connect the respective µLED-Components with the supply line, respectively, the switching transistors.

For the subpixels R1, R2 of the color R(ed) the pads 201 and 201' are foreseen for the p-contacting of the µLED-components. The pads 201 and 201' are connected in this embodiment with the supply line (not shown). In a similar manner are also the pads 202, 202' and 203, 203' designed for the p-contacting of the further µLED-components. Thereby, the size of the pads is chosen in such a way, that the respective µLED-components are placed directly on the pad surface and are contacted with this. Besides the p-contact pads 201, 201' to 203' further smaller pads are arranged on the surface, which can be combined into groups and are represented dashed. The group of the pads 211, 212 and 213 is designed as a n-contact pad and connected to the switching transistors, which provide during operation a smaller current than the "rated current". This group, therefore, is optional and corresponds to the branch with the transistor 111' in FIG. 5. The lower group of pads 221, 222, 223 is equally designed as re-contact pad and connected with the switching transistors, which during operation provide the larger current than the "rated current". It corresponds to the branch with the transistor 111" in FIG. 5. Both pad groups are optionally and then present, when besides the color location also brightness differences are to be compensated.

Between the p-contact pads 201, 201' and correspondingly between the p-contact pads of the other subpixels there are two further n-contact pads 231, 232, 233 arranged next to each other, which are each connected with the switching transistors 101 and 101', so that during operation the "rated current" flows. Now, the µLED-components are applied to the p-contact pads and subsequently connected appropriately by means of a bonding wire or another contacting technology to the necessary n-contact. If for example a µLED-component is used, which provides a slightly lower brightness at the "rated current", it has to be connected to the re-contact pad of the group with the pads 221, 222 and 223, to compensate the brightness difference. A second µLED-component provides instead the desired brightness at the "rated current" and correspondingly is connected with one of the pads of the group 231, 232 and 233. On the subpixels 203 and 203' this is exemplarily represented by the connecting wires 250.

The n-contact pads in this embodiment are designed substantially smaller than the p-contact pads, since they serve only for contacting and no µLED is placed on them. Between the pads an isolation is foreseen, so that no undesired short circuit occurs. Equally, after an assembly of the subpixels with the µLED-components the contact pads not used can be covered or isolated. The dimensions of both the contact pads can be in the range of a few µm, for example up to 200 µm. Typical dimensions for the p-contact pads, on which the µLED components are fixed, are in the range from 10 µm to 150 µm. Typical dimensions for the n-Contact pads are in the range from 10 µm to 50 µm. Besides the represented orientation, at which the n-contact pads of same current are arranged between the p-contact pads, also other orientations are conceivable. Thus, by the contacting of the n-contact pads it is defined, which of the switching transistors, which provide partly different current, will be connected with the µLED-component.

Figure 7:
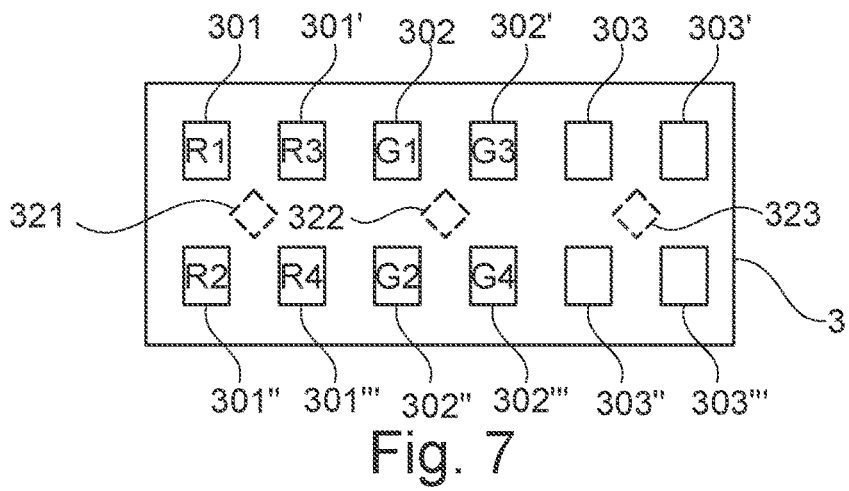
FIG. 7 shows an alternative embodiment of a surface to clarify further aspects.

FIG. 7 shows a further embodiment, at which the contact concept of the "common cathode" is followed. The p-contact of the µLED-components is located at the underside of the element. The "common cathode" concept differs from the concept of FIG. 6 in the fact, that switching transistor and µLED-component are "interchanged". While in FIG. 6 and also in the representations of FIGS. 4 and 5 the µLed-components are arranged between supply terminal and switching transistors, the µLED-components are at the "common cathode" concept between switching transistor and ground potential connection. The larger p-contact pads, four pieces for each subpixel (e.g. (R1, R2, R3, R4) for the subpixel of the color R(ed)) are connected to the respective switching transistors. Thereby one contact pad for each subpixel is omitted though, however, the space needed becomes larger per subpixel. The p-contact pads 301, 301', 302, 302', 303, 303' of the upper row of each subpixel are connected to the switching transistors for the "rated current", the p-contact pads 301", 301''', 302", 302''', 303" and 303''' of the lower row with the switching transistors for the higher, respectively, smaller current. Naturally, also another arrangement is possible, as for example one, at which the p-contact pads for the same "rated current" are arranged diagonally. Between the p-contact pads of each subpixel there is a smaller n-contact pad 321, 322, 323 (represented as dashed).

Figure 8:
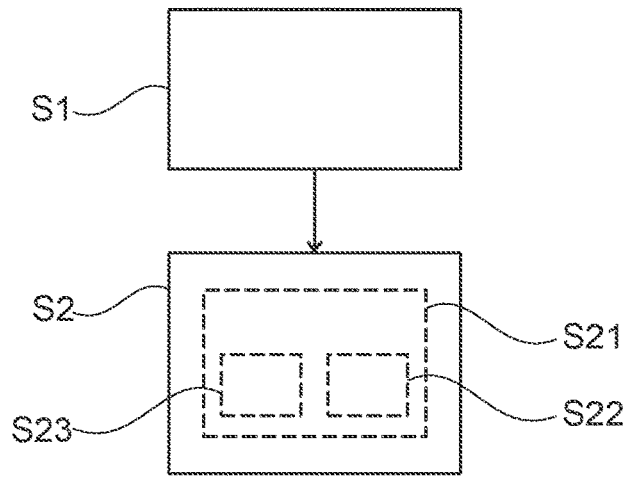
FIG. 8 shows an exemplary representation of the method for manufacturing a display.

FIG. 8 shows an embodiment of a method for manufacturing of a display comprising a plurality of pixel cells. The method provides in step S1 a matrix with at least two subpixel surfaces per color of a pixel, wherein the color is defined by a predefined target color location. The matrix can be part of a backplane or of a support, on which in the further course the LED-components are applied. In an alternative embodiment can also a support or a backplane be provided correspondingly, which comprises a plurality of pixels arranged in rows and columns.

In a second step S2 µLED-components are applied to at least two of the at least two subpixel surfaces with one optoelectronic component each defined by a color location. This is done in such, that during an operation of the two optoelectronic components the predefined target color location results.

The step S2 can comprise a whole set of further steps, which can be carried out chronologically before the step of the providing or chronologically after it. So it can be expedient, before an assembly with pieces of the surface, respectively, the subpixel surfaces to choose at least two µLED-components from a plurality of such components S21, which either both comprise the same color location, which corresponds to the target color location, or which both comprise different color locations, so that during operation the target color location is obtained by composition. The plurality of optoelectronic components can be divided before into different groups for example by color location, brightness or a combination of both.

On the surface of the backplane a plurality of contact pads is arranged. These form, respectively, define the subpixel surfaces. Thus, the at least two subpixel surfaces comprise at least two first contact pads and at least one second contact pad. For the assembly a first µLED-component is applied now in step S22 to a first of the at least two first contact pads and electrically conductively connected to this. A second µLED-component is applied then to a second of the at least two first contact pads and equally connected to this.

This process can be repeated for all subpixels, so that after the process of assembly each subpixel of each color and of each pixel comprises at least two µLED-Components. Subsequently a further connection step, S23, is carried out, at which for example by means of bonding method both the applied µLED-components are connected to the at least one second contact pad.

Although the invention has been illustrated and described in detail by means of the preferred embodiment examples, the present invention is not restricted by the disclosed examples and other variations may be derived by the skilled person without exceeding the scope of protection of the invention.

The invention claimed is:

1. An arrangement comprising:
a plurality of pixels,
wherein each pixel comprises at least two subpixels of each color,
wherein each color is defined by a predefined target color location,
wherein each subpixel comprises an optoelectronic component defined by a color location, the color location being an intrinsic feature of the optoelectronic component,
wherein the color locations of the optoelectronic components of each color is chosen such that during operation of the optoelectronic components the predefined target color location is met for each color,
wherein the optoelectronic components for each color are of identical design; and
a controller configured to commonly control the optoelectronic components of a color.

2. The arrangement according to claim 1, wherein the controller is configured to charge the optoelectronic components of a color with the same current and/or the controller is configured to charge one of the optoelectronic components of a color with a predefined rated current and the remaining optoelectronic components of this color with a higher current or a lower current as the predefined rated current.

3. The arrangement according to claim 1, wherein the controller comprises three control lines, and wherein each control line is coupled to switch inputs of at least two switching transistors, each of which is connected to one of the optoelectronic components.

4. The arrangement according to claim 3, wherein the controller further comprises at least one control transistor connected in each case between a control line and the switch inputs of the at least two switching transistors coupled to the control line.

5. The arrangement according to claim 3, wherein the controller comprises a storage capacitor connected between the switch inputs of the at least two switching transistors and a reference potential line.

6. The arrangement according to claim 3, wherein the controller comprises at least four switching transistors, two of which are configured to switch at the same control signal a predefined rated current and the other two are configured to switch a higher or lower current, respectively, than a predefined rated current.

7. The arrangement according to claim 1, wherein the controller comprises a supply line and a reference potential line, wherein in each case one of at least two switching transistors is connected in series with an optoelectronic component such that either the optoelectronic component is connected via a switching transistor with the supply line or the optoelectronic component is connected via a switching transistor with the reference potential line.

8. The arrangement according to claim 1, wherein the controller is integrated in a backplane, and wherein the optoelectronic components are arranged on contact pads of a surface of the backplane.

9. The arrangement according to claim 8, wherein at least some of the contact pads are connected with switching transistors.

10. A backplane of the arrangement according to claim 1, the backplane comprising:
the plurality of pixels arranged in rows and columns defined by a position on the backplane,
wherein each subpixel comprises at least one contact pad connected with the optoelectronic component.

11. The backplane according to claim 10, wherein the at least two subpixels of each color comprise at least two p-contact pads configured to receive the optoelectronic component and at least one n-contact pad configured to electrical contact the optoelectronic component.

12. The backplane according to claim 11, wherein the at least two p-contact pads are larger than the at least one n-contact pad.

13. The backplane according to claim 10, wherein the controller is configured to provide an equal reference current to the contact pads of the at least two subpixels of each color.

14. The backplane according to claim 10, wherein the controller is designed to provide a first current to a first contact pad of the subpixel and a second current to a second contact pad of the subpixel.

15. A method for manufacturing a display comprising a plurality of pixels, the method comprising:
providing a matrix with at least two subpixel surfaces per color of a pixel, wherein the color is defined by a predefined target color location; and
assembling optoelectronic components defined by color locations,
wherein each of the optoelectronic components is assembled on at least two of at least two subpixel surfaces such that the predefined target color location is met during operation of the two optoelectronic components, and
wherein each of the optoelectronic components for each subpixel is the same in design and/or material.

16. The method according to claim 15, wherein assembling comprises selecting at least two optoelectronic components from a plurality of optoelectronic components which is divisible in at least two groups and which each comprises a different color location.

17. The method according to claim 15,
wherein the at least two subpixel surfaces comprise at least two first contact pads and at least a second contact pad, and
wherein assembling comprises:
placing and electrical connecting of a first optoelectronic component on a first of the at least two first contact pads, and
electrical connecting the first optoelectronic components and second optoelectronic components with the at least one second contact pad.

* * * * *